(12) United States Patent
Martinez

(10) Patent No.: US 11,203,524 B2
(45) Date of Patent: Dec. 21, 2021

(54) MICROELECTROMECHANICAL SYSTEM CAVITY PACKAGING

(71) Applicant: TEXAS INSTRUMENTS INCORPORATED, Dallas, TX (US)

(72) Inventor: Jose Antonio Martinez, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/798,775

(22) Filed: Feb. 24, 2020

(65) Prior Publication Data

US 2020/0189910 A1 Jun. 18, 2020

Related U.S. Application Data

(62) Division of application No. 15/846,190, filed on Dec. 18, 2017, now Pat. No. 10,611,631.

(51) Int. Cl.
| | |
|---|---|
| *B81C 1/00* | (2006.01) |
| *B81B 7/00* | (2006.01) |
| *H01L 23/552* | (2006.01) |
| *H01L 23/00* | (2006.01) |

(52) U.S. Cl.
CPC ........ *B81C 1/00793* (2013.01); *B81B 7/0041* (2013.01); *B81C 1/00293* (2013.01); *B81C 1/00317* (2013.01); *H01L 23/552* (2013.01); *H01L 23/564* (2013.01); *B81B 2201/01* (2013.01); *B81B 2201/0221* (2013.01); *B81B 2201/042* (2013.01); *B81C 2201/053* (2013.01); *B81C 2203/0136* (2013.01)

(58) Field of Classification Search
CPC ............... H01L 21/02; H01L 21/02126; H01L 21/31116; H01L 21/50; H01L 21/56; H01L 21/568; H01L 21/6835; H01L 21/76813; H01L 21/7682; H01L 21/76849; H01L 21/7688; H01L 21/76898; H01L 23/3121; H01L 23/3135; H01L 23/315; H01L 23/5526; H01L 23/528; H01L 27/12; H01L 29/84; H01L 33/52; H01L 33/62; H01L 23/552; H01L 23/564; H01L 23/041–057; B81C 1/00269; B81C 2203/0109–0163; B81C 2201/053; B81C 1/00777–00833
See application file for complete search history.

(56) References Cited

U.S. PATENT DOCUMENTS

| | | | |
|---|---|---|---|
| 8,159,056 B1 * | 4/2012 | Kim ..................... | B81C 1/00333 257/678 |
| 2007/0058236 A1 * | 3/2007 | Shreeve ................. | G09G 3/346 359/245 |
| 2009/0267166 A1 | 10/2009 | Verheijden et al. | |
| 2010/0032775 A1 | 2/2010 | Morris, III et al. | |

(Continued)

*Primary Examiner* — Amar Movva
(74) *Attorney, Agent, or Firm* — Michelle F. Murray; Charles A. Brill; Frank D. Cimino

(57) ABSTRACT

In described examples, a cavity is formed between a substrate and a cap. One or more access holes are formed through the cap for removing portions of a sacrificial layer from within the cavity. A cover is supported by the cap, where the cover is for occulting the one or more access holes along a perspective. An encapsulant seals the cavity, where the encapsulant encapsulates the cover and the one or more access holes.

19 Claims, 6 Drawing Sheets

(56) References Cited

U.S. PATENT DOCUMENTS

2012/0153408 A1* 6/2012 in 't Zandt ......... B81C 1/00333
257/415
2012/0319528 A1* 12/2012 Jahnes .................... G06F 30/39
310/300
2017/0057809 A1 3/2017 Saint-Patrice et al.

* cited by examiner

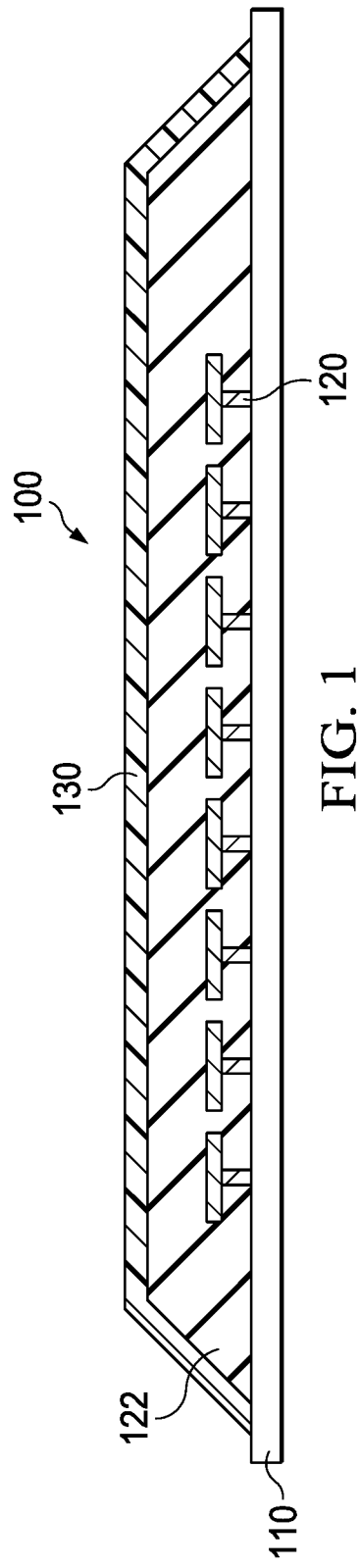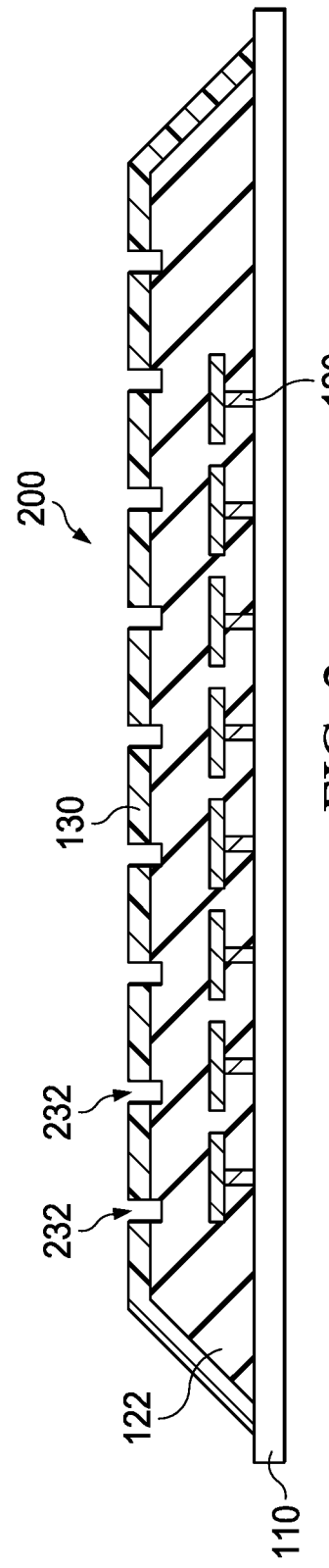

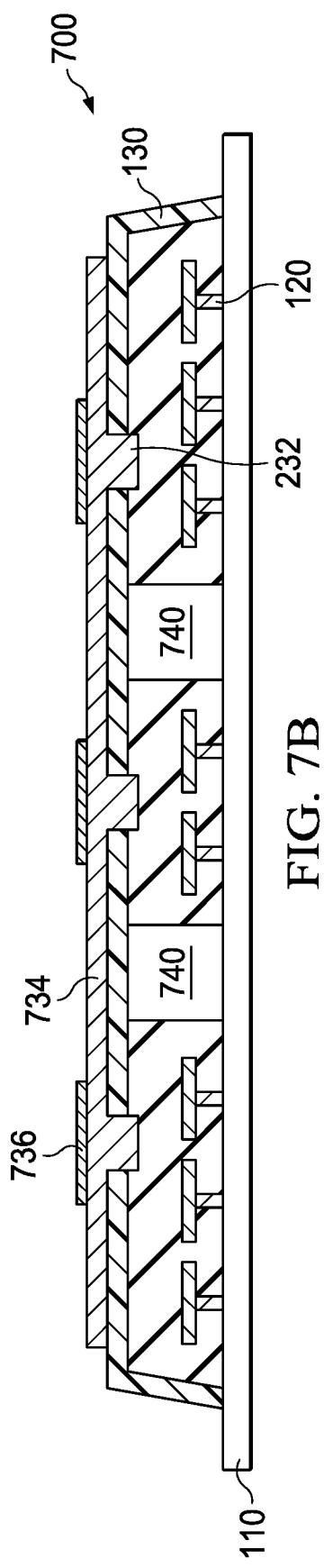
FIG. 7B
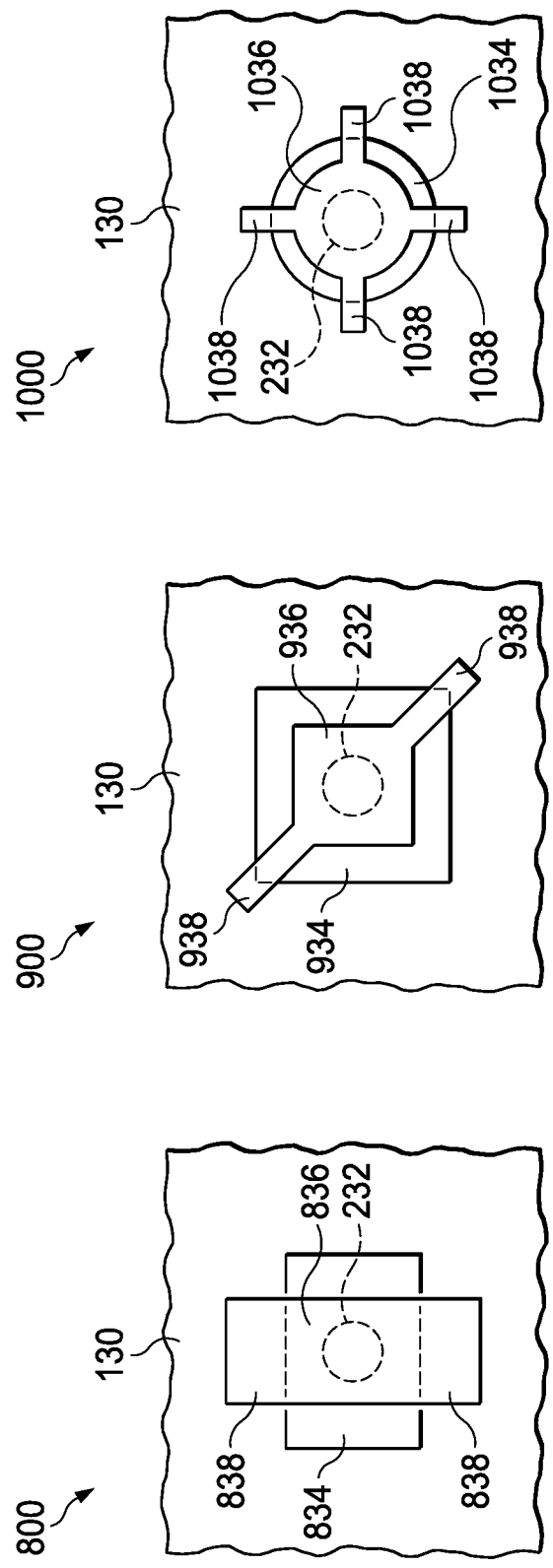
FIG. 8
FIG. 9
FIG. 10

MICROELECTROMECHANICAL SYSTEM CAVITY PACKAGING

CROSS-REFERENCE TO RELATED APPLICATIONS

This application is a divisional of U.S. patent application Ser. No. 15/846,190, filed Dec. 18, 2017, entitled "Microelectromechanical System Cavity Packaging," which application is hereby incorporated herein by reference in its entirety.

BACKGROUND

Electronic and electromechanical devices are often packaged in sealed enclosures. The sealed enclosures help protect such devices from contaminants, particles and moisture that might otherwise enter the package and mechanically or electrically disrupt normal operation of a device. The potential effects of contamination generally become greater as increasingly smaller design features are used. Various MEMS (microelectromechanical system) devices include moving components and structures (e.g., micro-miniaturized) that place unique demands on the sealed environment in which the MEMS devices are placed. The potential for contamination of the MEMS devices is often reduced by employing relatively more expensive processes and materials for packaging a MEMS device.

SUMMARY

In described examples, a cavity is formed between a substrate and a cap. One or more access holes are formed through the cap for removing a sacrificial layer from within the cavity. A cover is supported by the cap, where the cover is for occulting the one or more access holes along a perspective. An encapsulant seals the cavity, where the encapsulant encapsulates the cover and the one or more access holes.

BRIEF DESCRIPTION OF THE DRAWINGS

FIG. 1 is a section view of devices mounted within a first sacrificial layer on a substrate and covered by a cap in accordance with example embodiments.

FIG. 2 is a section view of access holes formed in the cap for exposing portions of the first sacrificial layer in accordance with example embodiments.

FIG. 7B is a section view of access hole covers formed over a second sacrificial layer and for covering rectangular access holes in accordance with example embodiments.

FIG. 8 is a top view of an integrated rectilinearly bridge-anchored cover in accordance with example embodiments.

FIG. 9 is a top view of an integrated diagonally bridge-anchored cover in accordance with example embodiments.

FIG. 10 is a top view of an integrated radially bridge-anchored in accordance with example embodiments.

DETAILED DESCRIPTION

Figure 3A:
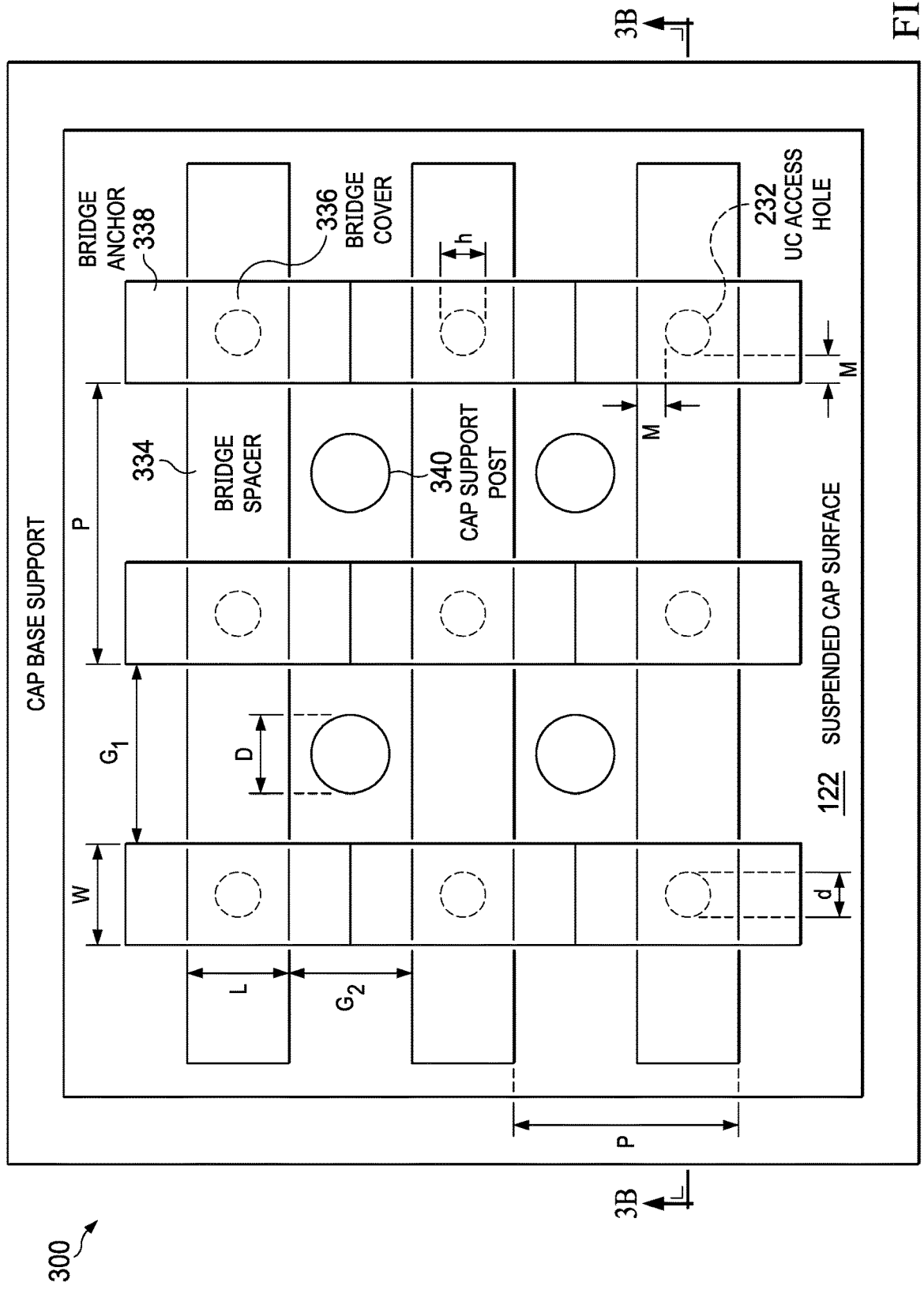
FIG. 3A is a top view of access hole covers formed over a second sacrificial layer deposited over circular access holes in accordance with example embodiments.

In this description, the term "portion" can mean an entire portion or a portion that is less than the entire portion, and the term "encapsulant" can mean a substance that encapsulates and seals a covered portion of a structure.

Batch processing techniques are used to manufacture a wide variety of devices. Such devices include microelectromechanical systems (MEMS) devices. The MEMS devices are usually small and often include structures formed at a micron scale. Such structures can include mechanically moving parts, which can be sensitive to heat buildup and contamination. Because of the potential for adverse effects of thermal build up and contamination from gases, moisture and particles, MEMS devices are often sealed for protection, for example. Accordingly, MEMS devices are usually placed on and/or formed on a substrate, such that the placed and/or formed MEMS devices are supported by the substrate and extend above the substrate. The MEMS devices are protected by a sealed enclosure configured to shield MEMS components against potentially adverse environmental conditions and contaminants.

A significant amount of the cost of finished MEMS devices relates to packaging. For example, the cost of the MEMS devices is often increased due to the selection and use of relatively expensive materials and processes suited for protecting the MEMS devices. Such costs can include costs of wafer bonding, custom singulation and die-level testing. Further, MEMS packaging often requires an interposer or sealing ring, which accounts for a significant amount of cost and footprint area of a packaged MEMS device.

In at least one example, a package is a substrate or a sealed container, which can include die, wafers and/or micromechanical devices in a local environment that is sealed from an outside environment. If MEMS devices are not adversely affected by water molecules, then non-hermetic sealing can be used. For example, packages can be sealed with non-hermetic sealants that include polymeric compounds. However, many MEMS devices are sensitive to effects of water molecules, so the MEMS devices are accordingly enclosed in packages that are hermetically sealed. For example, water-sensitive MEMS devices often include miniature moving parts that could undesirably adhere to adjacent surfaces as a result of static friction (stiction) caused by water molecules.

Some wafer-level packaging techniques construct a "cage," which includes a membrane with holes suspended above the MEMS structure. The membrane holes provide openings for an undercut (UC) agent to gain access inside the cage to help dissolve and evacuate a temporary support structure, upon which the cage is formed. The temporary support structure has an undercut cavity. After the undercut cavity is formed, the membrane holes are sealed by coating the membrane holes with a liquid encapsulant, which helps provide a non-hermetic seal. The liquid encapsulant is selected such that the surface tension of the liquid encapsulant helps prevent the liquid encapsulant against flowing inside the cage through the membrane holes. However, because of the encapsulant's chemical nature, the encapsulant's constituent materials (e.g. compounds, molecules and atoms) could outgas into the cavity, which can affect the operation of often-delicate MEMS structures.

Other wafer-level packaging techniques form undercut (UC) holes around the periphery (e.g. outer edges) of a cage, through which an undercut agent is introduced to remove the temporary support structure. For example, the UC holes are formed around the periphery (e.g., as viewed from the top), such that an undercut process proceeds radially inwards from the periphery to more central locations. However, the progression of that undercut process is non-uniform, which often leads to irregular evacuation of the temporary support structure. The irregular progression of the undercut process is worsened for larger cavities (and especially when the UC holes are formed around the peripheral edges), which can extend the exposure time of some MEMS devices to the undercut agent and thereby potentially damage some MEMS devices.

A low-cost process for sealing devices (e.g., MEMS devices during wafer-level packaging processes) is described herein. For example, a two-dimensional array of holes is formed in the surface of a cap (see FIG. 3A, for example) to provide access by an undercut agent for forming a cavity under the cap. A first set of holes is situated above a peripheral area of the cavity (e.g., to be formed), and a second set of holes is situated above a central area of the cavity. The relatively uniform distribution of the holes across the surface of the cap helps ensure a more predictably uniform progression of an undercut process for removing a sacrificial layer beneath the cap. For example, the more predictable rates of undercutting help protect MEMS devices from undercutting agents and increase yields by limiting exposure times of the MEMS devices to the undercutting agents. The two-dimensional array of holes is covered by covers (supported by bridge anchors) that restrict an anisotropically formed encapsulate against entering the holes of the two-dimensional array.

FIG. 1 is a section view of devices mounted within a first sacrificial layer on a substrate and covered by a cap in accordance with example embodiments. For example, the assembly 100 includes a substrate 110. The substrate 110 is usually a portion of a wafer suitable for manufacturing integrated circuits. For example, the substrate 110 can be a portion of a silicon crystal or other such material suited for forming MEMS devices.

The devices 120 are disposed (e.g., formed) on the substrate 110. A device 120 can be a MEMS device (such as an RF switch, a varactor or micromirror), which is potentially susceptible to failure resulting from contaminants introduced in various stages in a manufacturing process. The devices 120 can be formed before and/or during the deposition of a first sacrificial layer 122.

The first sacrificial layer 122 is deposited around (e.g., including above) the devices 120. The first sacrificial layer 122 can be formed by depositing a photoresist in accordance with a photolithographic process (e.g., such that sloped edges of the photoresist are formed along the edges). The first sacrificial layer 122 protects the devices 120 and provides a surface on which the cap 130 is formed. The first sacrificial layer 122 is suited for removal by a removal process, which is selected for removing the first sacrificial layer 122 without harming components of the devices 120, such as an undercut process that includes plasma etching or wet etching followed by a supercritical carbon dioxide drying process.

The cap 130 is formed for sealing the first sacrificial layer 122. For example, the cap 130 is a metal layer formed above the first sacrificial layer 122, such that the devices 120 and the first sacrificial layer 122 can be hermetically sealed. The cap 130 can be a metal such as aluminum, a dielectric such as silicon dioxide, or a ceramic such as titanium nitride. The cap 130 can be an inorganic material such as metal, dielectric or ceramic. The cap 130 can be transparent or opaque, or can have various degrees thereof (in between transparent and opaque).

A metal or other conductive layer (not shown) are optionally deposited via a physical vapor deposition (PVD) over the cap 130 (e.g., if the cap 130 is not a metal) to help hermetically seal and/or electrically shield the devices 120 arranged beneath the cap 130. The PVD layer can be an inorganic material, such as metal, dielectric or ceramic. The PVD layer can be transparent or opaque, or can have various degrees thereof (in between transparent and opaque). The PVD layer is deposited before forming access holes, such as described hereinbelow with reference to FIG. 2.

FIG. 2 is a section view of access holes formed in the cap for exposing portions of the first sacrificial layer in accordance with example embodiments. The assembly 200 includes undercut (UC) access holes 232, each for providing access for a UC agent to pass through the cap 130. For example, the access holes 232 are formed in accordance with a mask/reticle (not shown) for patterning a photoresist and etching selected locations.

An etch process is performed to etch through and evacuate the selected portions of the cap 130, such that access holes 232 are formed. The etch process can be a plasma (dry) etch or a wet etch in which the assembly 200 is submerged in a liquid etchant for etching structures not protected by a photoresist layer. The length of the etching process is controlled to control the depth of the etch, such that the access holes 232 extend from a top surface of the cap 130 downwards and expose portions of the first sacrificial layer 122.

In various embodiments, the access holes 232 can be one or more shapes of round (e.g., shown in top view in FIG. 3A), rectangular (e.g., shown in top view of FIG. 7), oval, elliptical, polygonal and polygonal with rounded corners. As described hereinbelow with reference to FIG. 3A, the access holes 232 are arranged in a two-dimensional pattern and/or grid to promote uniform etching of a first sacrificial layer 122 by UC agents (described hereinbelow).

FIG. 3A is a top view of access hole covers formed over a second sacrificial layer deposited over circular access holes in accordance with example embodiments. Assembly 300 includes a two-dimensional array of access holes 232 formed in the surface of the cap 130. A first set of access holes 232 is formed in a peripheral area of the cap 130, and a second set of access holes 232 is formed in a more central area of the cap 130 (e.g., between the optional one or more support posts 340). The relatively uniform distribution of the holes across the surface of the cap 130 helps ensure a more predictably uniform progression of an undercut process for removing the first sacrificial layer 122 beneath the cap 130.

After the access holes 232 are formed (such that the access holes 232 extend through the cap 130 and partially into the first sacrificial layer 122), a second sacrificial layer is deposited across the exposed structures (including access holes 232 and the surface of the cap 130) for forming bridge spacers 334. The bridge spacers 334 are for temporarily filling the access holes 232 and forming a planar surface covering one or more access holes 232. The bridge spacers 334 of the second sacrificial layer include an easily removed material, such as a photoresist, for forming a planar surface above the cap 130. The bridge spacers 334 are disposed as a temporary support surface upon which the covers 336 are formed.

In at least one example, the covers 336 are formed by depositing a metal layer for bridging a span of the bridge spacers 334. The deposited metal layer includes material for forming the cover 336 and is patterned and etched to selectively form the covers 336 (which are supported by one or more bridge anchors 338 after the bridge spacers 334 are removed). The covers 336 are arranged in a two-dimensional pattern, such as in first orientation arrays (e.g., rows) and in second orientation arrays (e.g., columns).

Each cover 336 is a bridge-like structure (as shown in a section view of FIG. 3B) for spanning a span "L" of the bridge spacers 334. Each cover 336 includes bridge anchors 338 formed to rest on the cap 132 surface (e.g., instead of resting on the second sacrificial layer of the bridge spacers 334). The covers 336 span a width "W," which is sufficiently wide for occulting an underlying access hole 232 structure (having a diameter "d" and centered in accordance with a pitch "P"). For example, the occultation exists in accordance with a directional perspective, such as a top view. Even after the access hole 232 is filled with material of the second sacrificial layer 334, this description continues referring to it as the access hole 232.

Each cover 336 can be spaced from an adjacent cover 336 by an interval "G1," which is sufficiently wide for forming a support post 340 between portions of the adjacent covers 336 (e.g., in a row). Support posts 340 are formed using UC-resistant materials and are optionally formed to support central portions (e.g., instead of peripheral portions) of the cap 130, especially in designs where many devices 120 are to be protected in a relatively large cavity 422 covered by a cap 130. In relatively large cavities, one or more access holes 232 (and covers 336) can be formed in the cap 130 between areas of the cap 130 supported by adjacent (including diagonally adjacent) support posts 340. Accordingly, one or more access holes can be formed within a first distance extending from the one of the one or more access holes to one of the two support posts, wherein the first distance is less than a second distance extending between the two support posts.

Each support post 340 supports an area of the cap 130 extending at least halfway to an adjacent support structure, such as another support post 340 or a vertically extending portion of the cap 130 that is formed on the substrate 110. The support posts 340 can help prevent the cap surface against flexing inwards (and/or breaking a seal) in response to forces (e.g., atmospheric pressure) applied to the cap 130. The support posts 340 can be an inorganic material such as metal, dielectric or ceramic. The support posts 340 can be transparent or opaque, or can have various degrees thereof (in between transparent and opaque).

Each contiguous instance of the bridge spacers 334 underlies one or more respective covers 336 and fills (e.g., plugs and/or planarizes) the access holes 232 to provide a planar surface for forming covers (e.g., rows of covers) 336. Instances of the bridge spacers 334 include a breadth "L," which is sufficient to span (and fill) the diameter "d" of the access holes 232. The distance between centers of the access holes (e.g., between centers of holes in rows, or in columns) can be determined based on etching rates and tolerance of included devices 120 to the selected etchant. Area-based etching rates are described hereinbelow with reference to FIG. 7A.

Accordingly, the access holes 232 are distributed across the top surface of the cap 130 in accordance with a first orientation (e.g., in rows) and a second orientation (e.g., in columns). The relatively even distribution of the access hole promotes more uniform progression of an etching process, such as to more carefully control exposure time of a device 120 to the selected etchant, and such as to increase yields.

Figure 3B:
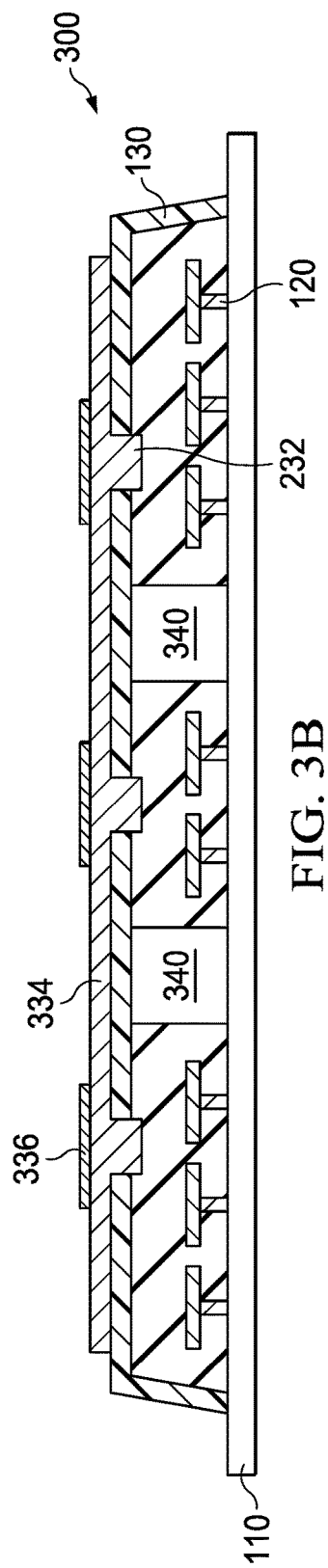
FIG. 3B is a section view of access hole covers formed over a second sacrificial layer and for covering circular access holes in accordance with example embodiments.

FIG. 3B is a section view of access hole covers formed over a second sacrificial layer and for covering circular access holes in accordance with example embodiments. Assembly 300 includes a substrate 110, over which a first sacrificial layer (such as the sacrificial layer 122) is formed for encapsulating devices 120. A cap 130 is formed over the first sacrificial layer and includes support posts 340, which are resistant to an etch (e.g., UC etching agent) for removing the first sacrificial layer 122 in a subsequent process. One or more access holes 232 are formed through the cap 130 (which are openings for introducing a UC etching agent to the first sacrificial layer 122 in a subsequent process). A second sacrificial layer for forming a bridge spacer 334 is deposited to blanket the access holes 232. The bridge spacer 334 is a temporary platform for forming the covers 336 (e.g., described hereinabove with respect to FIG. 3A). The covers 336 are for occulting a respective access hole along a perspective, such as a top view.

Figure 4:
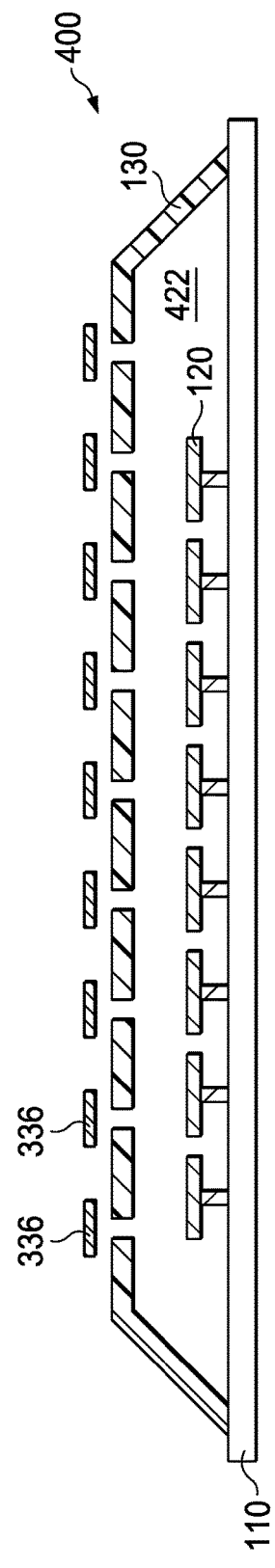
FIG. 4 is a section view of the substrate, the mounted devices, the cap and the suspended coverings after removal of the first and second sacrificial layers in accordance with example embodiments.

FIG. 4 is a section view of the substrate, the mounted devices, the cap and the suspended coverings after removal of the first and second sacrificial layers in accordance with example embodiments. Assembly 400 includes covers 336 arranged for occulting an open access hole (such as the open access hole 232). After the covers 336 are formed (e.g., where each cover 336 is supported by bridge anchors 338 formed on the cap 130 top surface), the first and second sacrificial layers are removed via an undercut (UC) process.

For example, the etching process begins by removing the directly exposed portions of the second sacrificial layer 334 and continues by etching the covered portions of the second sacrificial layer (e.g., a bridge spacer 334 underneath a respective cover 336) inwards toward the epicenter of a plugged access hole 232. The covers 336 remain supported by the associated bridge anchors 338, such that an occulting portion of each cover 336 is suspended above a respective access hole 232.

After the epicenter of an access hole 232 is exposed to the UC etch, portions of the second sacrificial layer 334 within an associated access hole 232 are removed by the etchant. Removal of the second sacrificial layer 334 evacuates an associated access hole 232, such that the etchant gains access to the first sacrificial layer 122 via the distributed (e.g., centrally and peripherally located) pattern of access holes 232.

The etch process proceeds radially downwards and outwards from each access hole 232 under the cap 130. The etch progresses such that portions of the first sacrificial layer 122 subjacent to an access hole 232 are etched at a uniform rate relative to the access hole 232. The UC etch process continues such that the sacrificial layer 122 is removed, and cavity 422 is formed. The devices 120 and support posts 340 are exposed within the cavity 422 formed by removal of the sacrificial layer 122 between the cap 130 and the substrate 110. The uniform distribution of access holes, the etching rate, and the timing of the etching rate helps ensure relatively uniform exposures times of various devices 120 to the UC agent that is used to undercut the cap 130.

Figure 5:
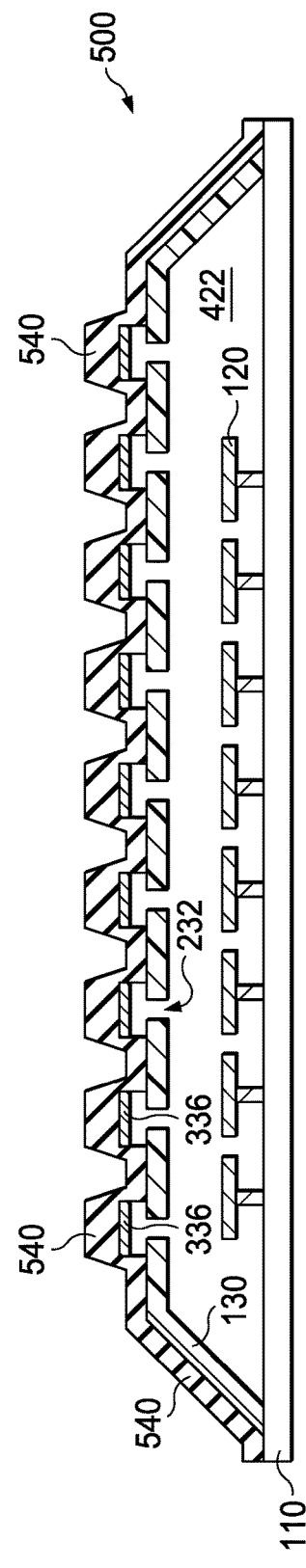
FIG. 5 is a section view of an anisotropic encapsulant layer for sealing the access holes in the cap in accordance with example embodiments.

FIG. 5 is a section view of an anisotropic encapsulant layer for sealing the access holes in the cap in accordance with example embodiments. The encapsulant layer 540 is deposited over the covers 336 and the cap 130 in accordance with an anisotropic process (e.g., in which properties of the processes are based on a direction of the application of a material by the process). For example, the encapsulant layer 540 is an inorganic compound selected and applied from an source above the assembly 500, such that the encapsulant layer 540 is deposited over uncovered surfaces (e.g., surfaces not covered by a cover 336 viewed from top view). Accordingly, the encapsulant is applied from a direction based on a perspective (e.g., top view) by which an access hole 232 is occulted (e.g., hidden from direct view) by a cover 336.

The anisotropically deposited encapsulant layer 540 forms a seal over exposed portions of the substrate 110, cap 130 and covers 336. Because of anisotropic properties, the encapsulant is limited against entering an open access hole 232 and against potentially contaminating one or more devices 120 via the open access hole 232.

In contrast, some encapsulation techniques rely on organic compounds, which rely on surface tension of the organic compounds to help impede intrusion through an open access hole. However, outgassing of the organic compounds can traverse the access hole (e.g., by process of diffusion) and contaminate underlying structures and devices. Further, such outgassing can be accelerated by heat applied to an organic encapsulant (e.g., where such heat is generated or absorbed during operation of the packaged devices).

Figure 6:
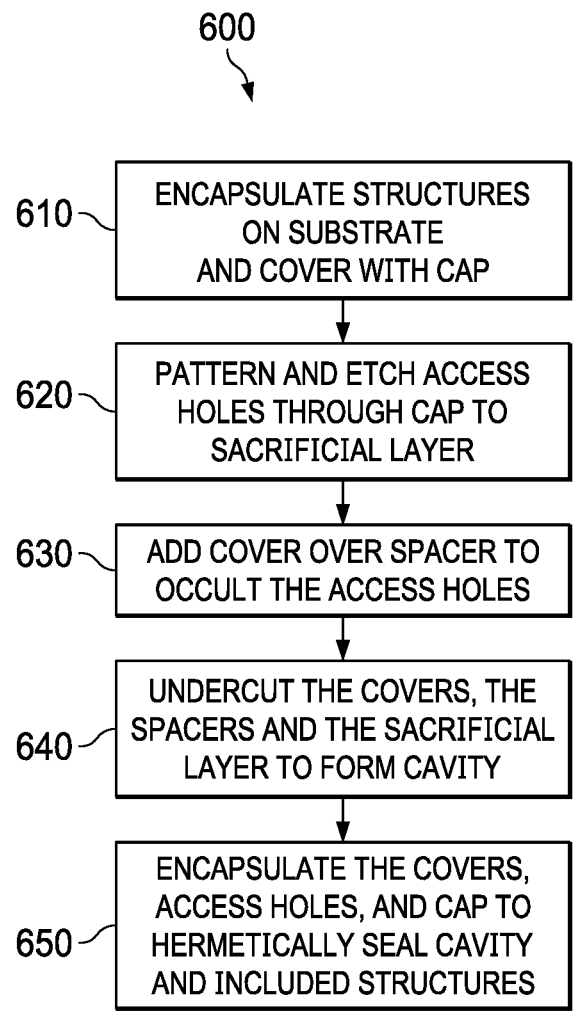
FIG. 6 is a flow diagram of a process for manufacturing devices, including encapsulated suspended access hole covers in accordance with example embodiments.

FIG. 6 is a flow diagram of a process for manufacturing devices, including encapsulated suspended access hole covers in accordance with example embodiments. Certain operations of flow 600 can be performed in an order other than a listed order. For example, structures of the devices 120 can be arranged on the substrate 110 before or during deposition of the first sacrificial layer 122.

The flow 600 begins at operation 610, in which structures on a substrate are encapsulated and covered with a cap. For example, a first sacrificial layer 122 is deposited around the devices 120 mounted on the substrate 110. The first sacrificial layer 122 can be formed by depositing a photoresist (e.g., such that a slope is formed along the outer edges of the first sacrificial layer 122). The first sacrificial layer 122 protects the devices 120 and provides a surface on which the cap 130 is formed. The cap 130 is formed for sealing the devices 120 within the first sacrificial layer 122. The flow 600 continues to operation 620.

At operation 620, access holes are formed by patterning and etching the access holes through the cap to the sacrificial layer. For example, a photoresist is deposited over the surface of the cap 130, and the deposited photoresist is exposed (e.g., with a reticle), such that locations for forming holes are patterned in the photoresist. A timed etch is performed to etch portions of the photoresist and cap 130 to form access holes 232. The duration of the etching process is controlled to control the depth of the etch, such that the holes 232 extend through the cap 130 and into a portion of the first sacrificial layer 122 (e.g., for ensuring a complete etch of the selected portions of the cap 130). As described with reference to FIG. 3A and FIG. 7A, the access holes 232 are arranged in a two-dimensional pattern and/or grid to promote uniform application and evacuation of UC agents. The flow 600 continues to operation 630.

At operation 630, a cover is formed over a spacer to occult the access hole. For example, a second sacrificial layer is deposited over the exposed access holes 232 and across a horizontal portion of the cap 130 to form a planar spacer 334 covering one or more access holes 232. The planar spacer 334 is a temporary support surface upon which the covers 336 are formed. In at least one example, the covers 336 are formed by depositing a metal layer for bridging the spacer 334 and occulting (in a first perspective such as a top view) the area defined by an associated access hole. The flow 600 continues to operation 640.

At operation 640, the first and second sacrificial layers are removed. For example, an undercut process etches away: the second sacrificial layer (e.g., beneath the covers 336 while leaving the covers 336 in place); and the portion of the second sacrificial layer filling the access holes 232. After progressing through the access holes 232, the undercut process etches away the first sacrificial layer, such that a cavity 422 is formed, and the devices 120 are no longer encapsulated by the first sacrificial layer. The flow 600 continues to operation 650.

At operation 650, an encapsulant seals the covers, access holes and cap. For example, an encapsulant 540 is deposited in an anisotropic process to encapsulate the covers 336 and the top surface of the cap 130. The anisotropic process deposits the encapsulant in accordance with a directionality associated with the first perspective. The access holes 232 are sealed because the encapsulant 540 is deposited to span the vertical voids between: the suspended edges of the covers 336; and the top surface of the cap 130. The anisotropically deposited encapsulant spans the vertical void without intruding underneath (e.g., into a space occulted by) a cover 336, such that the encapsulant does not traverse the access holes 232 and does not contaminate the devices 120. In an embodiment, the anisotropically deposited encapsulant seals: all of the access holes 232; and any margin between the cap 130 and the substrate 110. The encapsulant can be an inorganic or inorganic compound.

Figure 7A:
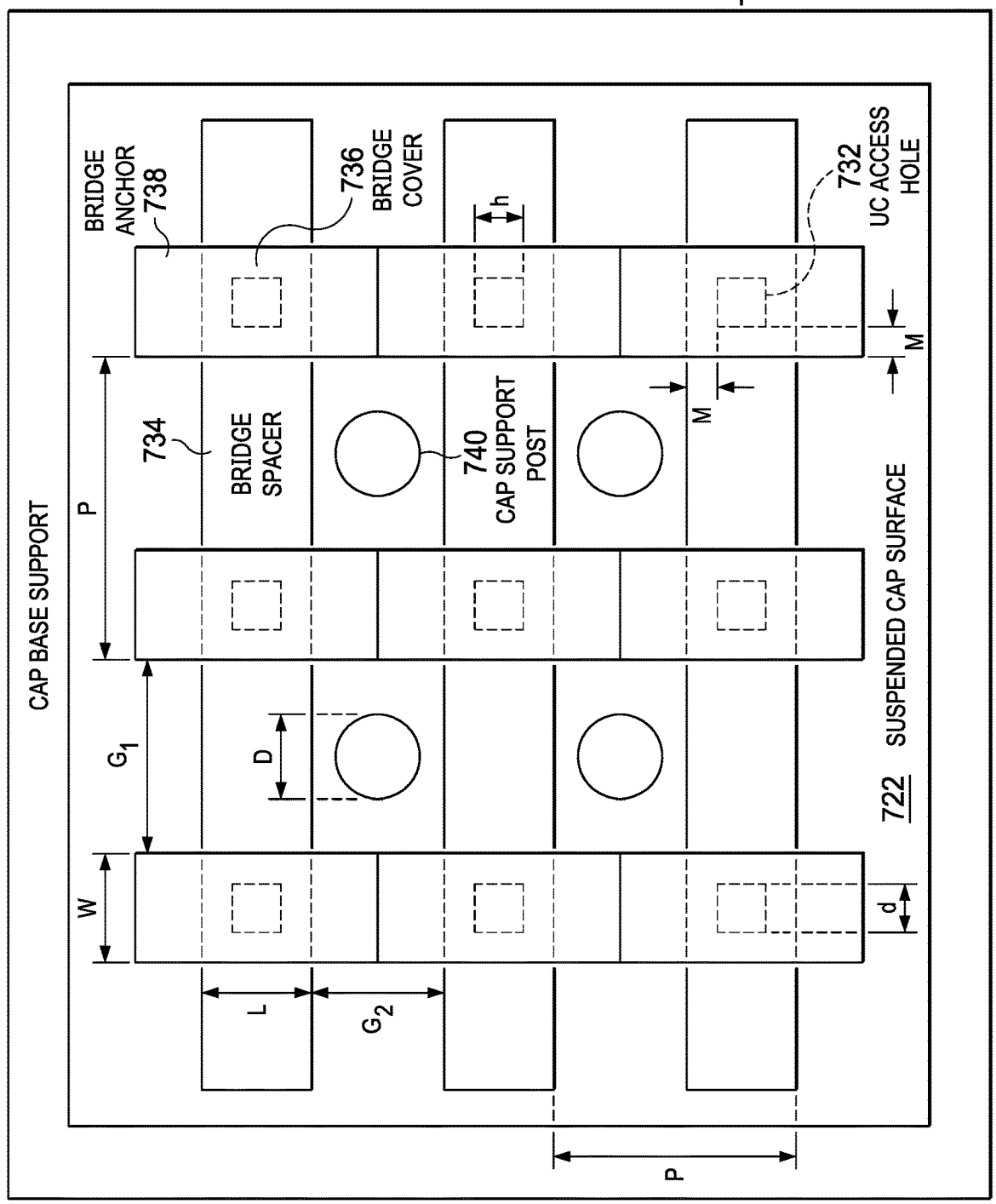
FIG. 7A is a top view of access hole covers formed over a second sacrificial layer deposited over rectangular access holes 232 in accordance with example embodiments.

FIG. 7A is a top view of access hole covers formed over a second sacrificial layer deposited over rectangular access holes 232 in accordance with example embodiments. Assembly 700 includes a two-dimensional array of access holes 732 formed in the surface of the cap 130. In at least one example, the access holes 732 are formed at a same height level as the surface of the cap 130. A first set of access holes 732 is formed in a peripheral area of the cap 130, and a second set of access holes 732 is formed in a more central area of the cap 130 (e.g., between the optional one or more support posts 740). The relatively uniform distribution of the holes across the surface of the cap 130 helps ensure a more predictably uniform progression of an undercut process for removing the first sacrificial layer 122 beneath the cap 130.

After the access holes 732 are formed, a second sacrificial layer is deposited across the exposed structures for forming bridge spacers 734. The bridge spacers 734 are for temporarily filling the access holes 732 and forming a planar surface covering one or more access holes 732. In at least one example, the covers 736 are formed by depositing a metal layer for bridging a span of the bridge spacers 734. The deposited metal layer includes material for forming the cover 736 and is patterned and etched to selectively form the covers 736.

Each cover 736 is a bridge-like structure for spanning a span "L" of the bridge spacers 734. Each cover 736 includes bridge anchors 738 formed to rest on the cap 132 surface. Each cover 736 (including bridge anchors 738) is spaced from other covers 736 in accordance with a pitch "P." The covers 736 each are sufficiently wide to span a width "W," which is sufficiently wide for occulting an underlying access hole 732 structure (having a first length "d," a second length "h" orthogonal to the first width, and centered in accordance with a pitch "P").

Each cover 736 can be spaced from an adjacent cover 736 by an interval "$G_1$," which is sufficiently wide for forming a support post 740 between portions of the adjacent covers 736 along a first dimension (e.g., in a row). Each cover 736 can be spaced from an adjacent cover 736 by an interval "$G_2$," which is length of two bridge anchors 738 along a second dimension (e.g., in a column). Support posts 740 are formed using UC-resistant materials and are optionally formed to support central portions of the cap 130.

Each contiguous instance of the bridge spacers 734 underlies one or more respective covers 736 and fills the access holes 732 to provide a planar surface for forming covers 736. Instances of the bridge spacers 734 include a breadth "L," which is sufficient to span (and fill) the width "d" of the access holes 732. The distance between centers of the access holes (e.g., between centers of holes in rows, or in columns) can be determined based on etching rates and tolerance of included devices 120 to the selected etchant. Further, the duration of the etching can be based on the etching rate and the percentage of open area.

The percentage of open area for an embodiment can be determined in accordance with Equation (1):

$$Percentage_{OpenArea} = 100 \times \frac{d-h}{P^2} \quad (1)$$

where P>5. Different values for the Equations hereinabove can be selected in accordance with relative strengths of structures and etchants of various embodiments.

TABLE I shows example percentages of open area determined in accordance with selected values of P, d, and h and Equation (1):

TABLE I

| P (in microns) | d (in microns) | h (in microns) | % Area Covered |
|---|---|---|---|
| 8 | 3 | 4 | 19% |
| 12 | 7 | 8 | 39% |
| 16 | 11 | 12 | 52% |
| 20 | 15 | 16 | 60% |

In accordance with the dimensions of TABLE I, reticles for forming the bridge spacers 734, bridge covers 736, bridge anchors 738 and support post 740 are useful to manufacture test devices, so etch rates (and consistency of etch rates) are measurable to determine optimum materials, processes and etch durations. The determined optimum materials, processes and etch durations can be used in mass production for higher yield rates.

Accordingly, the access holes 732 are distributed across the top surface of the cap 130 in accordance with a first orientation (e.g., in rows) and a second orientation (e.g., in columns). The relatively even distribution of the access hole promotes more uniform progression of an etching process, such as to more carefully control exposure time of a device 120 to the selected etchant, and such as to increase yields.

FIG. 7B is a section view of access hole covers formed over a second sacrificial layer and for covering rectangular access holes in accordance with example embodiments. Assembly 700 includes a substrate 110, over which a first sacrificial layer 122 is formed for encapsulating devices 120. A cap 130 is formed over the first sacrificial layer 122 and includes support posts 740, which are resistant to an etch (e.g., UC etching agent) for removing the first sacrificial layer 122 in a subsequent process. Through the cap 130, one or more access holes 232 is/are formed as opening(s) for introducing a UC etching agent to the first sacrificial layer 122 in a subsequent process. A second sacrificial layer for forming a bridge spacer 734 is deposited to blanket the access holes 732. The bridge spacer 734 is a temporary platform for forming the covers 736 (e.g., described hereinabove with respect to FIG. 7A). The covers 736 are for occulting a respective access hole along a perspective, such as a top view.

FIG. 8 is a top view of an integrated rectilinearly bridge-anchored cover in accordance with example embodiments. The top view 800 includes a rectangular cover 836 for occulting the access hole 232 in the cap 130. The spacer 834 is a patterned second sacrificial layer 334. The spacer 834 provides a planar surface upon which the cover 836 is formed. For example, the cover 836 is formed over the spacer 834, such that the bridge anchors 838 extend beyond the extent of the spacer 834 and rest (e.g., are anchored) on the top surface of the cap 130. The cover 836 is formed such that, when the spacer 834 is removed and the access hole 232 is reopened, the access hole is occulted by the cover 834. Over the area previously occupied by the spacer 834, the cover 836 is supported by the bridge anchors 838 (e.g., which can be integrally formed with the cover 836). The bridge anchors 838 are contiguous with the portion of the cover 836 that is overlying the space previously occupied by the spacer 834.

FIG. 9 is a top view of an integrated diagonally bridge-anchored cover in accordance with example embodiments. The top view 900 includes a square cover 936 for occulting the access hole 232 in the cap 130. The spacer 934 is a patterned second sacrificial layer 334. The spacer 934 provides a planar surface upon which the cover 936 is formed. For example, the cover 936 is formed over the spacer 934, such that diagonal bridge anchors 938 extend beyond the extent of the spacer 934 and rest (e.g., are anchored) on the top surface of the cap 130. The cover 936 is formed such that, when the spacer 934 is removed and the access hole 232 is reopened, the access hole is occulted by the cover 934. Over the area previously occupied by the spacer 934, the cover 936 is supported by the diagonal bridge anchors 938 (e.g., which can be integrally formed with the cover 936). The diagonal bridge anchors 938 are contiguous with the portion of the cover 936 that is overlying the space previously occupied by the spacer 934. In an embodiment, a diagonal bridge anchor is formed at each of the corners of the square cover 936.

FIG. 10 is a top view of an integrated radially bridge-anchored in accordance with example embodiments. The top view 1000 includes a circular cover 1036 for occulting the access hole 232 in the cap 130. The spacer 1034 is a patterned second sacrificial layer 334. The spacer 1034 provides a planar surface upon which the cover 1036 is formed. For example, the cover 1036 is formed over the spacer 1034, such that radial bridge anchors 1038 extend beyond the extent of the spacer 1034 and rest (e.g., are anchored) on the top surface of the cap 130. The cover 1036 is formed such that, when the spacer 1034 is removed and the access hole 232 is reopened, the access hole is occulted by the cover 1036. Over the area previously occupied by the spacer 1034, the cover 1036 is supported by the radial bridge anchors 1038 (e.g., which can be integrally formed with the cover 1036). The radial bridge anchors 1038 are contiguous with the portion of the cover 1036 that is overlying the space previously occupied by the spacer 1034. In various embodiments, radial bridge anchor are formed around the circular cover 1036, such that the angle subtended between any two radially adjacent bridge anchors 1038 is less than 180 degrees.

Accordingly, in described examples, one or more devices is/are mounted on a substrate and covered by a cap. In at least one example, the one or more devices is/are encapsulated in a first sacrificial layer, over which the cap is formed. Access holes are formed through the cap to expose portions of the first sacrificial layer. A second sacrificial layer is deposited to fill and cover the access holes to form a spacer. A bridge structure is deposited over the spacer and patterned to form a cover for occulting the situs of each access hole as viewed from a first perspective. The first and second sacrificial layers are evacuated by etching the first and second sacrificial layer, which re-exposes the access holes. The access holes are sealed by depositing a contiguous anisotropic encapsulant over the suspended coverings and portions of the cap.

Modifications are possible in the described embodiments, and other embodiments are possible, within the scope of the claims.

What is claimed is:

1. A method of producing a device, the method comprising:
    forming a first layer over one or more devices;
    forming a cap over the one or more devices encapsulated in the first layer;
    forming one or more access holes through the cap;
    forming a second layer over the one or more access holes;
    forming, on the second layer, one or more covers over the one or more access holes; and
    removing the first layer and the second layer.
2. The method of claim 1, further comprising mounting the one or more devices on a substrate.
3. The method of claim 2, comprising:
    forming a first support post between the cap and the substrate; and
    forming a second support post between the cap and the substrate.
4. The method of claim 3, a first distance between the first support post and the second support post, a second distance between the one or more access holes and the first support post, wherein the second distance is less than the first distance.
5. The method of claim 1, wherein the one or more devices comprises a microelectromechanical system (MEMS) device.
6. The method of claim 1, wherein removing the first layer and the second layer comprises removing the first layer and undercutting the second layer via the one or more access holes.
7. The method of claim 1, wherein removing the first layer and the second layer comprises:
    plasma etching the second layer; and
    performing a supercritical carbon dioxide drying process.
8. The method of claim 1, wherein removing the first layer and the second layer comprises:
    wet etching the second layer; and
    performing a supercritical carbon dioxide drying process.
9. The method of claim 1, further comprising depositing an encapsulant by an anisotropic process.
10. The method of claim 9, wherein the encapsulant comprises an inorganic substance.
11. The method of claim 1, wherein the one or more access holes are in a two-dimension array of holes.
12. The method of claim 1, wherein forming the first layer comprises depositing a photoresist.
13. The method of claim 1, wherein the cap comprises metal, a dielectric material, or a ceramic.
14. The method of claim 1, wherein forming the cap comprises depositing an inorganic layer by physical vapor deposition (PVD).
15. The method of claim 1, wherein forming the one or more access holes comprises:
    patterning a photoresist layer to produce a patterned photoresist layer; and
    etching the one or more access holes in the cap in accordance with the patterned photoresist layer.
16. The method of claim 1, wherein the one or more access holes are round, rectangular, oval, elliptical, polygonal, or polygonal with rounded corners.
17. The method of claim 1, wherein forming the one or more access holes comprises:
    forming a first set of access holes in a peripheral area of the cap; and
    forming a second set of access holes in a central area of the cap.
18. The method of claim 1, wherein the one or more covers comprises metal.
19. The method of claim 1, wherein the cover occults the one or more access holes.

* * * * *